United States Patent
Sakimura et al.

(10) Patent No.: US 8,693,238 B2
(45) Date of Patent: Apr. 8, 2014

(54) MRAM HAVING VARIABLE WORD LINE DRIVE POTENTIAL

(75) Inventors: Noboru Sakimura, Tokyo (JP); Takeshi Honda, Tokyo (JP); Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 365 days.

(21) Appl. No.: 12/376,925

(22) PCT Filed: Jul. 13, 2007

(86) PCT No.: PCT/JP2007/064003
§ 371 (c)(1),
(2), (4) Date: Sep. 8, 2009

(87) PCT Pub. No.: WO2008/018266
PCT Pub. Date: Feb. 14, 2008

(65) Prior Publication Data
US 2010/0177558 A1    Jul. 15, 2010

(30) Foreign Application Priority Data
Aug. 7, 2006 (JP) .................................. 2006-214267

(51) Int. Cl.
G11C 11/00 (2006.01)
G11C 8/00 (2006.01)

(52) U.S. Cl.
USPC ..................... 365/158; 365/148; 365/230.07

(58) Field of Classification Search
USPC ........... 365/157, 158, 171–173, 145, 149, 48, 365/55, 62, 66, 74, 100, 130, 131, 148, 209, 365/213, 225.5, 230.07, 232, 243.5
See application file for complete search history.

(56) References Cited

U.S. PATENT DOCUMENTS

| 5,640,343 | A | 6/1997 | Gallagher et al. |
| 6,349,054 | B1 | 2/2002 | Hidaka |
| 6,370,058 | B1 | 4/2002 | Fukumoto |
| 6,490,192 | B2 | 12/2002 | Thewes et al. |
| 6,545,906 | B1 | 4/2003 | Savtchenko et al. |

(Continued)

FOREIGN PATENT DOCUMENTS

| JP | 11-195824 | 7/1999 |
| JP | 11-204854 | 7/1999 |

(Continued)

OTHER PUBLICATIONS

Hosomi et al., "A Novel Nonvolatile Memory with Spin Torque Transfer Magnetization Switching: Spin-RAM", (International Electron Devices Meeting Technical Digest, pp. 473-476, 2005.

(Continued)

*Primary Examiner* — Tuan T Nguyen
*Assistant Examiner* — Khamdan Alrobaie
(74) *Attorney, Agent, or Firm* — Young & Thompson (57) ABSTRACT

An MRAM of a spin transfer type is provided with a memory cell 10 and a word driver 30. The memory cell 10 has a magnetic resistance element 1 and a selection transistor TR having one of source/drain electrodes which is connected with one end of the magnetic resistance element 1. The word driver 30 drives a word line WL connected with a gate electrode of the selection transistor TR. The word driver 30 changes a drive voltage of the word line WL according to the write data DW to be written in the magnetic resistance element 1.

18 Claims, 7 Drawing Sheets

(56) References Cited

U.S. PATENT DOCUMENTS

| | | |
|---|---|---|
| 6,614,682 B2 | 9/2003 | Hirai |
| 6,804,144 B2 | 10/2004 | Iwata |
| 6,834,005 B1 | 12/2004 | Parkin |
| 6,839,272 B2 | 1/2005 | Ooishi |
| 6,856,539 B2 | 2/2005 | Hidaka |
| 6,862,210 B2 | 3/2005 | Tsuchida et al. |
| 6,870,788 B2 | 3/2005 | Shimizu et al. |
| 6,914,808 B2 | 7/2005 | Inaba |
| 6,961,261 B2 | 11/2005 | Iwata |
| 6,980,465 B2 | 12/2005 | Taussig et al. |
| 7,064,974 B2 | 6/2006 | Suzuki et al. |
| 7,184,301 B2 | 2/2007 | Sugibayashi et al. |
| 7,193,284 B2 | 3/2007 | Yagami |
| 7,376,005 B2 * | 5/2008 | Hidaka ............... 365/158 |
| 7,417,914 B2 | 8/2008 | Shimizu et al. |
| 2002/0071306 A1 | 6/2002 | Thewes et al. |
| 2004/0100845 A1 * | 5/2004 | Subramanian et al. ....... 365/209 |
| 2005/0000222 A1 | 1/2005 | Matsutera et al. |
| 2005/0105342 A1 * | 5/2005 | Tang et al. ............. 365/189.01 |
| 2006/0114618 A1 | 6/2006 | Hosomi et al. |
| 2007/0171704 A1 | 7/2007 | Hung et al. |
| 2010/0157662 A1 | 6/2010 | Ono et al. |

FOREIGN PATENT DOCUMENTS

| | | |
|---|---|---|
| JP | 2000-057761 | 2/2000 |
| JP | 2000-195250 | 7/2000 |
| JP | 2000-207886 | 7/2000 |
| JP | 2001-210073 | 8/2001 |
| JP | 2001-273758 | 10/2001 |
| JP | 2002-170937 | 6/2002 |
| JP | 2002-197852 | 7/2002 |
| JP | 2002-269968 | 9/2002 |
| JP | 2002-541607 | 12/2002 |
| JP | 2003-036203 | 2/2003 |
| JP | 2003-151267 | 5/2003 |
| JP | 2004-164719 | 6/2004 |
| JP | 2004-206796 | 7/2004 |
| JP | 2004-207707 | 7/2004 |
| JP | 2004-213771 | 7/2004 |
| JP | 2004-220759 | 8/2004 |
| JP | 2004-241451 | 8/2004 |
| JP | 2004-348934 | 12/2004 |
| JP | 2005-19561 | 1/2005 |
| JP | 2005-505889 | 2/2005 |
| JP | 2005-93488 | 4/2005 |
| JP | 2005-182986 | 7/2005 |
| JP | 2005-191032 | 7/2005 |
| JP | 2006-005308 | 1/2006 |
| JP | 2006-73930 | 3/2006 |
| JP | 2006-93432 | 4/2006 |
| JP | 2006-270069 | 10/2006 |
| WO | 03082460 | 10/2003 |
| WO | 2006-115275 | 11/2006 |
| WO | 2007-015474 | 2/2007 |
| WO | 2007-015475 | 2/2007 |

OTHER PUBLICATIONS

Yamaguchi et al., Real-Space Ovservation of Current-Driven Domain Wall Motion in Submicron Magnetic Wires, vol. 92, No. 7.

Yagami et al., "Research Trends in Spin Transfer Magnetization Switching", vol. 28, No. 9, 2004. pp. 937-948.

Notice of Allowance mailed Dec. 7, 2010 in U.S. Appl. No. 11/996,711.

Japanese Office Action in corresponding Japanese Application No. 2006-157574 mailed on Jan. 16, 2012.

JP Office Action dated May 11, 2012, with English Translation, Application No. 2007-530951.

JP Office Action dated May 29, 2013, with English translation; Application No: 2012-150643.

* cited by examiner

MRAM HAVING VARIABLE WORD LINE DRIVE POTENTIAL

TECHNICAL FIELD

The present invention relates to a magnetic random access memory (MRAM) and an operating method. More particularly, the present invention relates to a write control technique in an MRAM of a spin transfer type.

BACKGROUND ART

An MRAM is a hopeful nonvolatile memory from the viewpoint of high integration and high speed operation. In the MRAM, the magnetic resistance element showing Magnetic Resistance Effect such as a TMR (Tunnel Magneto Resistance) is used. Specifically, the magnetic resistance element has a magnetic tunnel junction (MTJ) in which a tunnel barrier layer is put between two ferromagnetic layers, and this is referred to as an MTJ element. The two ferromagnetic layers are a pinned layer whose magnetization orientation is fixed, and a free layer whose magnetization orientation can be inverted.

A resistance value $(R+\Delta R)$ of the MTJ when the magnetization orientations of the pinned layer and that of the free layer are "anti-parallel" is known to be larger than a resistance value (R) when they are "parallel" depending on the magnetic resistance element. An MR ratio $(\Delta R/R)$ is known to be between several 10% and several 100%. In the MRAM, a data is stored in a non-volatile manner by using such an MTJ element for a memory cell, and using the change in the resistance value. A read operation is carried out by supplying current through the MTJ element to detect the resistance value. A write operation into the memory cell is carried out by inverting the magnetization orientation of the free layer.

As write methods into the MRAM, an asteroid method and a toggle method have been conventionally known. According to these write methods, the inverting magnetic field required to invert the magnetization of the free layer increases substantially reversely proportional to a memory cell size. In short, there is a tendency that, as the memory cell is made smaller, write current becomes greater.

As a write method that can suppress increase in write current which is caused due to a fine structure, a "spin transfer method" has been proposed. For example, please refer to Japanese Patent Application Publications (JP-P2004-207707A, JP-P2005-19561A, and JP-P 2006-93432A), "A Novel Nonvolatile Memory with Spin Torque Transfer Magnetization Switching: Spin-RAM" by H. Hosomi, et al. (International Electron Devices Meeting, Technical Digest, pp. 473-476, 2005). According to the spin transfer method, a spin-polarized current is injected into a ferromagnetic conductor, and the magnetization is inverted through interaction between a spin of each carrier electrons for the current and a magnetic moment of the conductor (hereafter, to be referred to as "spin transfer magnetization switching"). The outline of the spin transfer magnetization switching will be described below with reference to FIG. 1.

Figure 1:
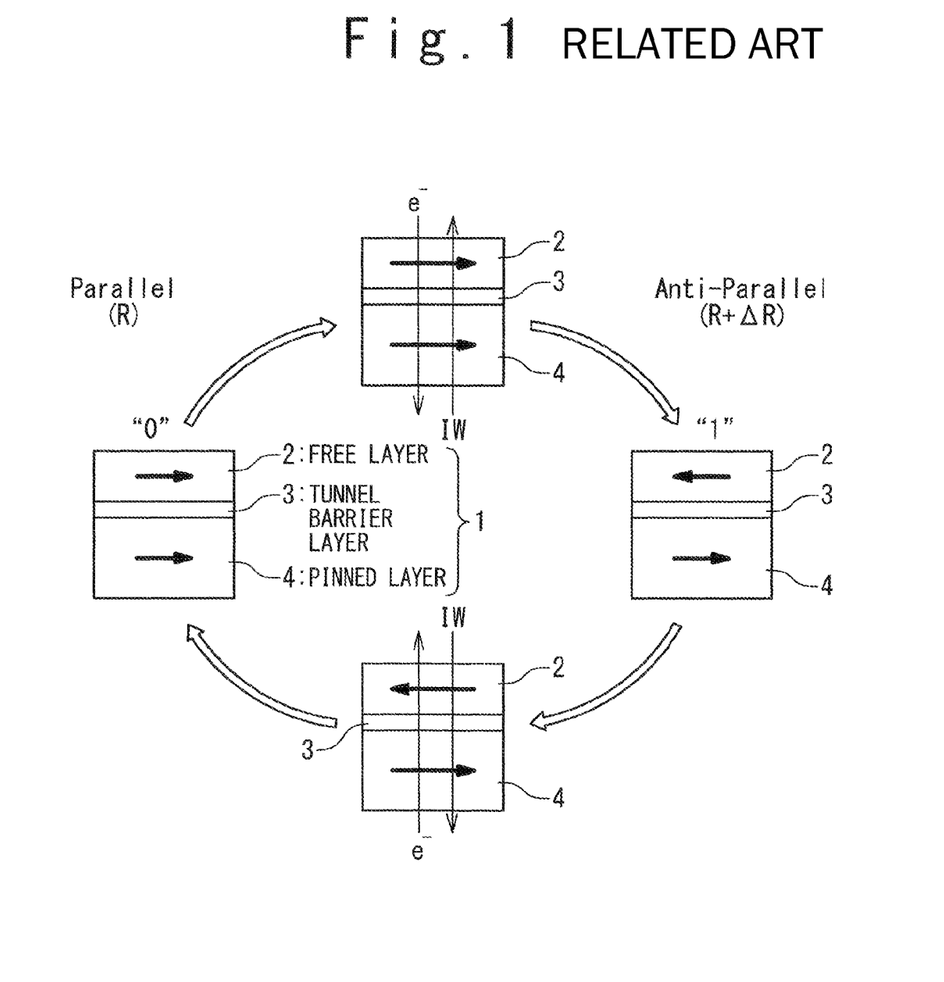
FIG. 1 is a conceptual diagram showing data write in accordance with a spin transfer method.

In FIG. 1, an MTJ element 1 includes a free layer 2 and a pinned layer 4, which are magnetic layers, and a tunnel barrier layer 3 of a non-magnetic layer which is put between the free layer 2 and the pinned layer 4. Here, the pinned layer 4 whose magnetization orientation is fixed is formed to be thicker than the free layer 2 and carries out the role as a mechanism (spin filter) for generating the spin-polarized current. A situation in which the magnetization orientation of the free layer 2 and that of the pinned layer 4 are parallel corresponds to a data "0", and a situation in which they are i-parallel corresponds to a data "1".

The spin transfer magnetization inversion shown in FIG. 1 is attained by a CPP (Current Perpendicular to Plane) method, and a write current IW is perpendicularly injected to the film plane. Specifically, at the time of transition from the data "0" to the data "1", the write current IW flows from the pinned layer 4 to the free layer 2. In this case, the electron having the same spin state as the pinned layer 4 serving as the spin filter moves from the free layer 2 to the pinned layer 4. Then, through the spin transfer (the transfer/reception of a spin angle motion amount) effect, the magnetization of the free layer 2 is inverted. On the other hand, at the time of the transition from the data "1" to the data "0", the write current IW flows from the free layer 2 to the pinned layer 4. In this case, the electron having the same spin state as the pinned layer 4 serving as the spin filter moves from the pinned layer 4 to the free layer 2. As a result, by the spin transfer effect, the magnetization of the free layer 2 is inverted.

In this way, in the spin transfer magnetization inversion, the data is written through the movement of the spin electron. On the basis of the direction of the spin-polarized current that is injected perpendicularly to the film plane, it is possible to define the magnetization orientation of the free layer 2. Here, the threshold of the write (the magnetization inversion) is known to be based on a current density. Thus, as the memory cell size is made smaller, the write current necessary for the magnetization inversion is decreased. Since the write current is decreased in association with the finer structure of the memory cell, the spin transfer magnetization inversion is important to attain a large capacity of MRAM.

Figure 2A:
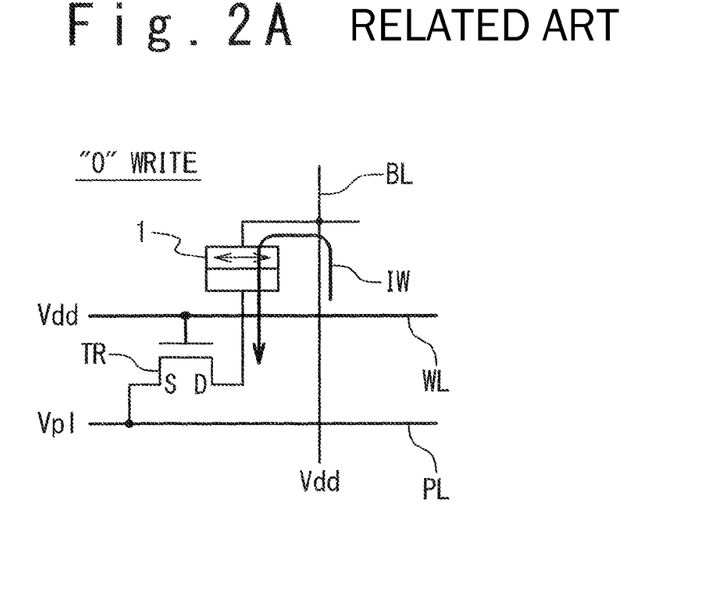
FIG. 2A is a circuit diagram schematically showing a conventional write of "0"
Figure 2B:
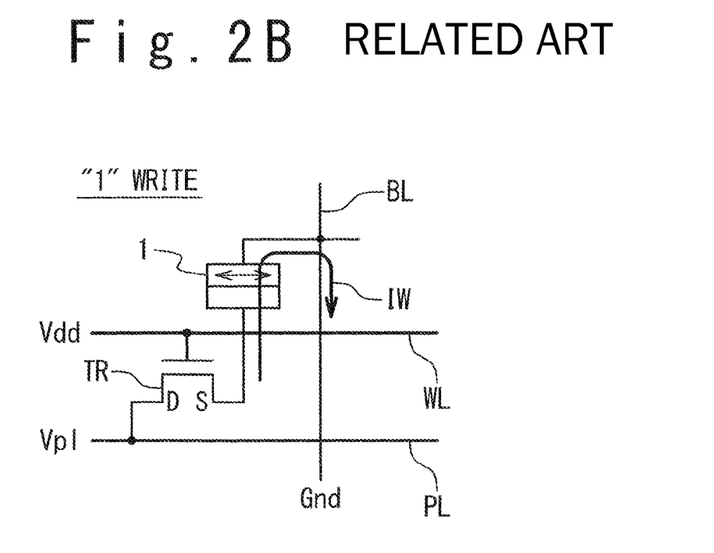
FIG. 2B is the circuit diagram schematically showing a conventional write "1"

FIGS. 2A and 2B show one memory cell and schematically show a conventional circuit configuration to select the memory cell and attain the two-way write current IW. One memory cell has the MTJ element 1 and a selection transistor TP. One end of the MTJ element 1 is connected to a bit line BL, and the other end is connected to the selection transistor TR. One of source/drain electrodes of the selection transistor TR is connected to the MTJ element 1, and the other electrode is connected to a plate line PL. A voltage of the plate line PL is fixed to a middle voltage Vp1 (=Vdd/2). A gate electrode of the selection transistor TR is connected to a word line WL.

When a data is written, the power supply voltage Vdd is applied to the word line WL. Consequently, the selection transistor TR is turned ON. When "0" is written, as shown in FIG. 2A, the power supply voltage Vdd is applied to the bit line BL. As a result, the write current IW flows from the bit line BL (voltage Vdd) to the plate line PL (voltage Vp1). On the other hand, when "1" is written, as shown in FIG. 2B, a ground potential is applied to the bit line BL. As a result, the write current IW flows from the plate line PL (voltage Vp1) to the bit line BL (voltage 0). In this way, the write current IW can be supplied in the two ways to the MTJ element 1.

DISCLOSURE OF INVENTION

The inventor paid attention to the following point. That is, in the MRAM of the spin transfer type, the current route is equal between the write operation and the read operation. Thus, the relation of tradeoff exists between a write margin and a read margin.

For example, it is supposed that the resistance value of the MTJ is designed to be relatively small, in order to secure a large write current at the time of the write operation. In this case, with regard to the resistance value detected at the time of the read operation, the contribution of the on resistance of the selection transistor TR is great, so that a variation ΔR in the resistance value of the MTJ is made non remarkable. That is, the quality of a read signal is deteriorated, which makes the accurate data read difficult. In order to avoid such a situation, the MR ratio is required to be designed to be several 100% or more. However, as the MR ratio becomes higher, the resistance value of the MTJ in the state of data "1" (anti-parallel state) becomes greater. In this case, at the time of transition from the data "1" state to the data "0" state, it becomes difficult to supply the sufficient write current IW exceeding the threshold.

In this way, the tradeoff relation exists between the write operational margin and the read operational margin. This tradeoff imposes a limit on the resistive property (the resistance value and the MR ratio) required for the MTJ element 1. In this way, the operational margin in the MRAM of the spin transfer type cannot be always said to be wide. Thus, it is necessary to strictly design the write threshold and the resistive property of the MTJ element 1.

One means for solving the problem of the tradeoff is to reduce the on resistance of the selection transistor TR. By minimizing the on resistance of the selection transistor TR, it becomes easy to supply the write current IW exceeding the threshold. As one method of reducing the on resistance, the increase in the size of the selection transistor TR is considered. However, in that case, the size of the memory cell is simultaneously increased. Thus, this method is not desirable from the viewpoint of the large capacity of MRAM. In the MRAM of the spin transfer type, a technique is desired that can supply the sufficient write current IW without increasing the memory cell size.

In a first aspect of the present invention, an MRAM of a spin transfer type is provided. The MRAM includes a memory cell and a word driver. The memory cell has a magnetic resistance element and a selection transistor in which one of source/drain electrodes is connected to one end of the magnetic resistance element. The word driver drives a word line connected to a gate electrode of the selection transistor. According to the present invention, the word driver changes a drive voltage of the word line on the basis of a write data to be written into the magnetic resistance element.

By such a configuration, it is made possible to freely adjust a gate-source voltage in the selection transistor on the basis of the write data. The on resistance of the selection transistor becomes greater, as the gate-source voltage becomes lower, and this becomes smaller as the gate-source voltage becomes higher. Thus, by adjusting the drive voltage of the word line to increase the gate-source voltage, it is possible to reduce the on resistance of the selection transistor. As the on resistance is reduced, it becomes easier to supply the write current exceeding the threshold.

For example, the conventional configuration shown in FIG. 2A and FIG. 2B is considered. When "1" is written as shown in FIG. 2B, the gate-source voltage of the selection transistor TR is higher than "Vdd−Vpl" at least. However, when "0" is written as shown in FIG. 2A, the gate-source voltage of the selection transistor TR is "Vdd−Vpl" at most. Thus, especially, when "0" is written, the on resistance of the selection transistor TR becomes great (between several kΩ and several 10 kΩ). Such a great on resistance causes the write current value which can be supplied, to be decreased. Moreover, since the resistance value of the MTJ in the data "1" state is great, it becomes further difficult to secure the sufficient write current IW when "0" is written.

Therefore, according to the present invention, in an example shown in FIG. 2A, the word driver drives the word line with a voltage higher than the power supply voltage. As a result, the gate-source voltage becomes sufficiently high, which reduces the on resistance of the selection transistor. As the on resistance becomes smaller, it becomes easier to supply the write current exceeding the threshold. Here, in order to reduce the on resistance, the size of the selection transistor is not required to be increased. Also, in order to increase the supplyable write current, a strict limit is not required to be imposed on the resistive property of the MTJ element. In short, a permissible range of the resistance value of the MTJ element is made wide. In this way, according to the present invention, the operational margin of the MRAM is improved.

In a second aspect of the present invention, a write method of an MRAM by employing a spin transfer method is provided. The MRAM includes a magnetic resistance element and a memory cell having a selection transistor in which one of source/drain electrodes is connected to one end of the magnetic resistance element. The write method according to the present invention includes (A) driving the word line connected to a gate electrode of the selection transistor with a first drive voltage, when a write data to be written into the magnetic resistance element is a first data; and (B) driving the word line with a second drive voltage higher than the first drive voltage, when the write data is a second data opposite to the first data.

According to the present invention, since the drive voltage of the word line is adjusted on the basis of the write data, it is possible to reduce an on resistance of the selection transistor. Thus, the supplyable write current is increased, and it becomes easier to supply the write current exceeding the threshold. Here, the size of the selection transistor is not required to be made larger, allow a larger capacity of MRAM. Also, a strict limit is not required to be imposed on a resistive property of the MTJ element, and a permissible range of the resistance value is made wide. In this way, it is possible attain the MRAM of the spin transfer type having the wide operational margin.

BEST MODE FOR CARRYING OUT THE INVENTION

The magnetic random access memory (MRAM) according to the present invention and an operating method will be described below with reference to the attached drawings. In the MRAM according to the present invention, a data is written in accordance with a spin transfer method.

1. First Exemplary Embodiment

Figure 3A:
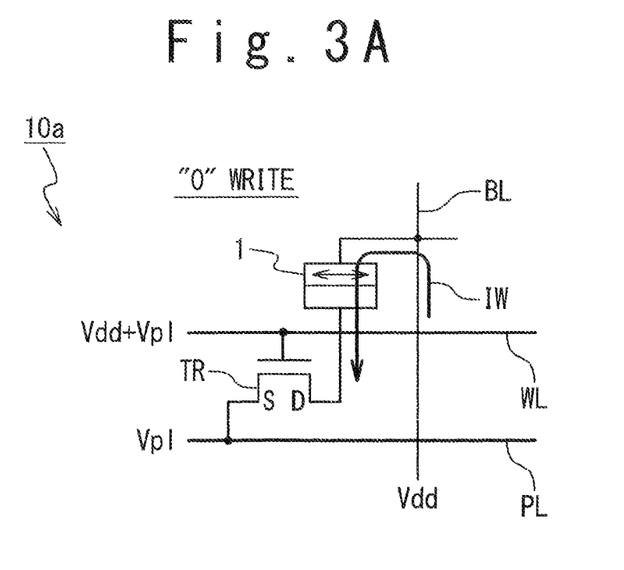
FIG. 3A is a circuit diagram schematically showing a write of "0" in an MRAM according to a first exemplary embodiment of the present invention.
Figure 3B:
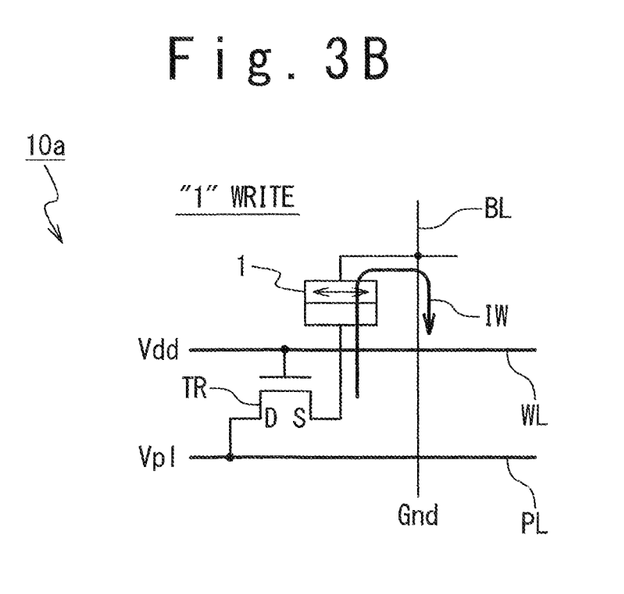
FIG. 3B is a circuit diagram schematically showing a write of "1" in the MRAM according to the first exemplary embodiment of the present invention.

FIG. 3A and FIG. 3B are schematic diagrams showing the configuration and data write of a memory cell 10a according to a first exemplary embodiment. The memory cell 10a contains an MTJ element 1 and a selection transistor (cell transistor) TR. The selection transistor TR is a MOS transistor.

The MTJ element 1 has a structure similar to the structure shown in FIG. 1. That is, the MTJ element 1 has a bottom pin structure in which a free layer 2 is formed through a tunnel barrier layer 3 on a pinned layer 4. In FIG. 3A and FIG. 3B, the magnetization of the free layer 2 is indicated by an arrow mark. One end of the MTJ element 1 is connect a bit line BL, and the other end thereof is connected to the selection transistor TR. In detail, the free layer 2 of the MTJ element 1 is connected to the bit line BL, and the pinned layer 4 is connected to one of source/drain electrodes of the selection transistor TR.

A gate electrode of the selection transistor TR is connected to a word line WL. One of the source/drain electrodes of the selection transistor TR is connected to the MTJ element 1, and the other is connected to a plate line PL. The plate line PL is a common interconnection commonly connected to memory cells, and its voltage is fixed to a predetermined voltage Vpl. The voltage Vpl is a middle voltage between a power supply voltage Vdd and a ground voltage Gnd. Typically, it is Vdd/2.

FIG. 3A shows a case where "0" is written into the memory cell 10a. When "0" is written, the power supply voltage Vdd higher than the middle voltage Vpl is applied to the bit line BL. At this time, the write current IW flows from the bit line (voltage Vdd) to the plate line PL (voltage Vpl). In short, in the MTJ element 1, the write current IW flows from the free layer 2 to the pinned layer 4. As a result, by the spin transfer magnetization inversion, the data "0" is written into the MTJ element 1.

Here, according to this exemplary embodiment, in order to turn ON the selection transistor TR, a voltage Vdh higher than the usual power supply voltage Vdd is applied to the gate electrode of the selection transistor TR. That is, the word line WL is driven with the drive voltage Vdh higher than the power supply voltage Vdd. For example, the drive voltage Vdh is set to Vdd+Vpl. In this case, a gate-source Voltage (a voltage difference Vgs between a gate voltage and a source) of the selection transistor TR is "Vdd". This value is sufficiently higher than the conventional gate-source voltage "Vdd–Vpl" in FIG. 2A.

On the other hand, FIG. 3B shows a case where "1" is written into the memory cell 10a. When "1" is written, the word line WL is driven at the power supply voltage Vdd, and the power supply voltage Vdd is applied to the gate electrode of the selection transistor TR. The ground potential Gnd lower than the middle potential Vp1 is applied to the bit line BL. At this time, the current IW flows from the plate line PL (Potential: Vpl) to bit line BL (Potential: 0). In short, in the MTJ element 1, the write current IW flows from the pinned layer 4 to the free layer 2. As a result, through the spin transfer magnetization inversion, the data "1" is written into the MTJ element 1.

In this way, according to this exemplary embodiment, the drive voltage of the word line WL is the data to be written into the memory cell 10a. In short, the gate-source voltage in the selection transistor TR can be adjusted as necessary. The on resistance of the selection transistor TR becomes higher, as the gate-source voltage becomes lower, and this becomes lower, as the gate-source voltage becomes higher. Thus, by adjusting the drive voltage of the word line WL, it is possible to reduce the on resistance of the selection transistor TR when the data is written. As the on resistance becomes smaller, it becomes easier to supply the write current IW exceeding the threshold.

Tentatively, it is supposed that the drive voltage of the word line WL is always set to the power supply voltage Vdd (refer to FIG. 2A and FIG. 2B). In this case, the gate-source voltage when "1" is written is higher than at least "Vdd–Vpl". However, the gate-source voltage when "0" is written is "Vdd–Vpl" at most. The case where "0" is written is lower in the gate-source voltage and greater in the on resistance of the selection transistor TR. Thus, it is preferred to reduce the on resistance when "0" is written at least. Thus, as shown in FIG. 3A, when "0" is written, the word line WL is driven with the drive voltage Vdh higher than the power supply voltage Vdd. As a result, the gate-source voltage is higher than "Vdd–Vpl", and the on resistance is further reduced. Therefore, the supplyable write current increases, and it becomes easier to supply the write current IW exceeding the threshold.

According to this exemplary embodiment, in order to reduce the on resistance of the selection transistor TR, the size of the selection transistor TR is not required to be enlarged. Thus, it is possible to attain a larger capacity of MRAM. Also, in order to increase the supplyable write current, a strict limit is not required to be imposed to the resistive property of the MTJ element 1. Therefore, permissible range of the resistance value for the MTJ element 1 is made wider. In this way, the operational margin of the MRAM is improved.

It should be noted that the MTJ element 1 may have a top pin structure in which the pinned layer 4 is formed through the tunnel barrier layer 3 on the free layer 2, instead of the bottom pin structure. In this case, the pinned layer 4 is connected to the bit line BL, and the free layer 2 is connected to the selection transistor TR. The direction of the write current IW becomes opposite only, and the discussion similar to the foregoing discussion is applied thereto. In short, when "1" is written, the word line WL may be driven with the drive voltage Vdh.

2. Second Exemplary Embodiment

Figure 4A:
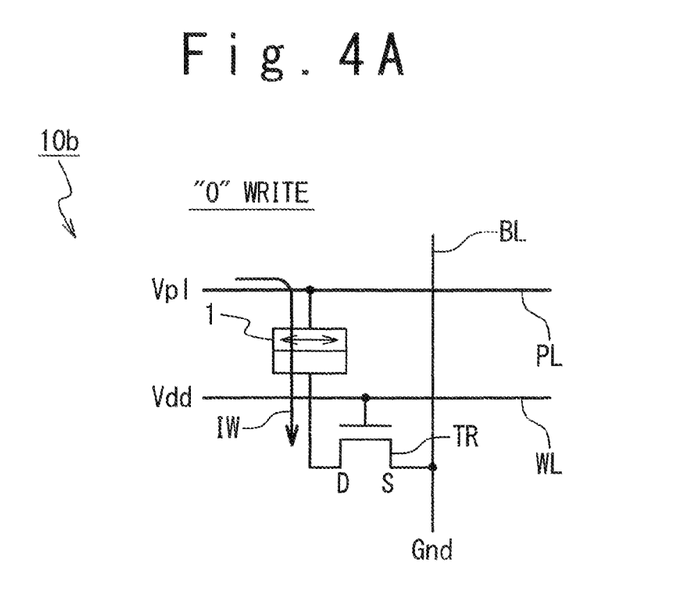
FIG. 4A is a circuit diagram schematically showing a write of "0" in the MRAM according to a second exemplary embodiment of the present invention.
Figure 4B:
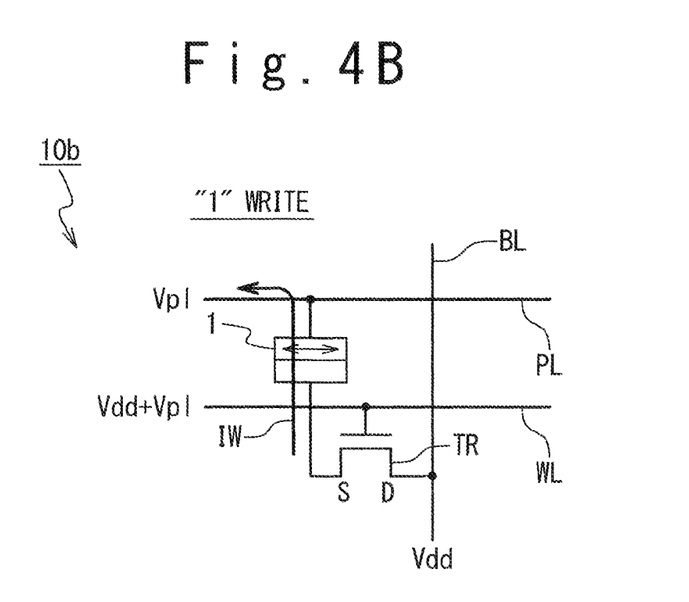
FIG. 4B is a circuit diagram schematically showing a write of "1" in the MRAM according to the second exemplary embodiment of the present invention.

FIG. 4A and FIG. 4B are schematic diagrams showing the configuration of a memory cell 10b and data write, according to the second exemplary embodiment. Hereinafter, the same description as that in the first exemplary embodiment is properly omitted.

One end of the MTJ element is connected to the plate line PL, and the other end thereof is connected to the selection transistor TR. In detail, the free layer 2 of the MTJ element 1 is connected to the plate line PL, and the pinned layer 4 is connected to one of the source/drain electrodes of the selection transistor TR. The other of the source/drain electrodes of the selection transistor TR is connected to the word line WL.

FIG. 4A shows the "0" write into the memory cell 10b. When "0" is written, the word line WL is driven with the power supply voltage Vdd, and the power supply voltage Vdd is applied to the gate electrode of the selection transistor TR. The ground voltage Gnd lower than the middle voltage Vp1 is applied to the bit line BL. At this time, the write current IW flows from the plate line PL (voltage Vpl) to the bit line BL (voltage 0). In short, in the MTJ element 1, the write current IW flows from the free layer 2 to the pinned layer 4. As a result, through the spin transfer magnetization inversion, the data "0" is written into the MTJ element 1.

On the other hand, FIG. 4B shows the "1" write into the memory cell 10b. When "1" is written, the word line WL is driven with the drive voltage Vdh higher than the power supply voltage Vdd. For example, its drive voltage Vdh is set to Vdd+Vpl. The power supply voltage Vdd higher than the middle voltage Vp1 is applied to the bit line BL. At this time, the write current IW flows from the bit line BL (voltage Vdd) to the plate line BL (voltage Vpl). In short, in the MTJ element 1, the write current IW flows from the pinned layer 4 to the free layer 2. As a result, through the spin transfer magnetization inversion, the data "1" is written, into the MTJ element 1.

Tentatively, it is supposed that the drive voltage of the word line WL is always set to the power supply voltage Vdd. In this case, the gate-source voltage when "0" is written is "Vdd−Gnd". However, the gate-source voltage when "1" is written is less than "Vdd−Gnd". The case where "1" is written is lower in the gate-source voltage and greater in the on resistance of the selection transistor TR. Thus, it is preferred to reduce the on resistance when "1" is written at least. Thus, as shown in FIG. 4E, when "1" is written, the word line WL is driven with the drive voltage Vdh higher than the power supply voltage Vdd. As a result, the gate-source voltage is further increased, and the on resistance is further creased. Therefore, the supplyable write current is increased, and it becomes easier to supply the write current IW exceeding the threshold.

In this way, in this exemplary embodiment, the drive voltage of the word line WL is varied on the basis of the data to be written into the memory cell 10b. In short, the gate-source voltage in the selection transistor TR is adjusted as necessary, and the on resistance is reduced. Thus, the effect similar to the first exemplary embodiment is obtained.

It should be noted that the MTJ element 1 may have the top pin structure in which the pinned layer 4 is formed through the tunnel barrier layer 3 on the free layer 2, instead of the bottom pin structure. In this case, the pinned layer 4 is connected to the plate line PL, and the free layer 2 is connected to the selection transistor TR. In that case, although the direction of the write current IW becomes opposite, the discussion similar to the foregoing discussion is applied thereto. In short, when "0" is written, the word line WL may be driven with the drive voltage Vdh.

3. Third Exemplary Embodiment

Figure 5A:
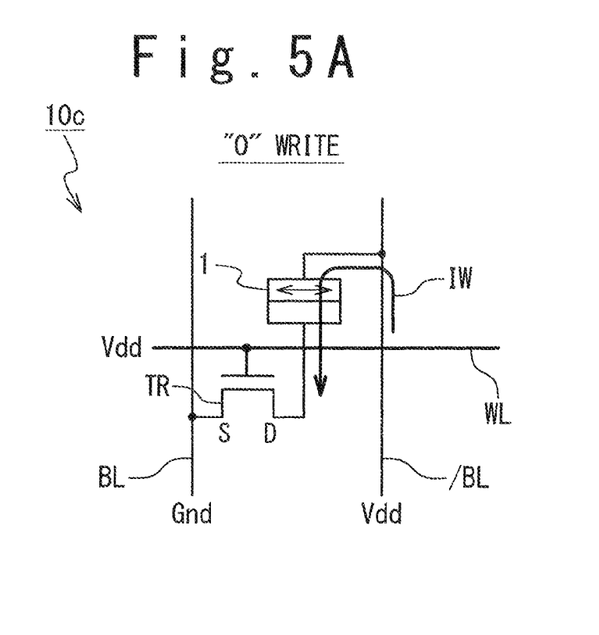
FIG. 5A is a circuit diagram schematically showing a write of "0" in the MRAM according to a third exemplary embodiment of the present invention.
Figure 5B:
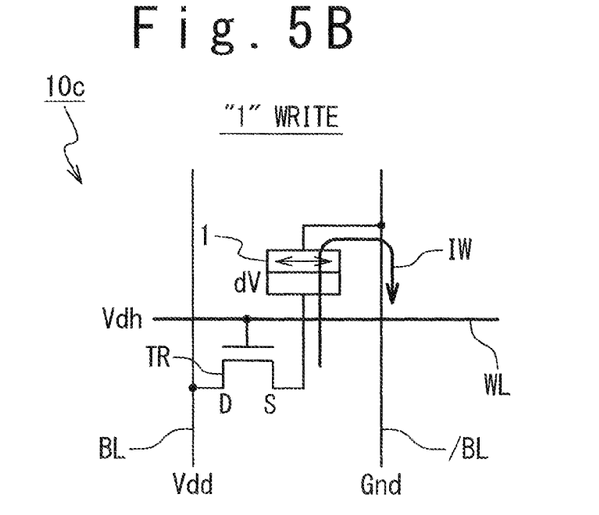
FIG. 5B is a circuit diagram schematically showing a write of "1" in the MRAM according to the third exemplary embodiment of the present invention.

FIG. 5A and FIG. 5B are schematic diagrams showing the configuration of a memory cell 10c and data write, according to the third exemplary embodiment. Hereinafter, the same description as that in the first exemplary embodiment is properly omitted.

The gate electrode of the selection transistor TR is connected to the word line WL. One of the source/drain electrodes of the selection transistor TR is connected to a first bit line BL, and the other thereof is connected to one end (pinned layer 4) of the MTJ element 1. The other end (free layer 2) of the MTJ element 1 is connected to a second bit line /BL. The first bit line BL and the second bit line /BL configure a complementary bit line pair. In short, when the power supply voltage Vdd is applied to the first bit line BL, the ground voltage Gnd is applied to the second bit line /BL. When the ground voltage Gnd is applied to the first bit line BL, the power supply voltage Vdd is applied to the second bit line /BL.

FIG. 5A shows the "0" write into the memory cell 10c. When "0" is written, the word line WL is driven with the power supply voltage Vdd, and the power supply voltage Vdd is applied to the gate electrode of the selection transistor TR. The ground voltage Gnd is applied to the first bit line BL, and the power supply voltage Vdd is applied to the second bit line /BL. At this time, the write current IW flows from the second bit line /BL (voltage Vdd) to the first bit line BL (voltage 0). In short, in the MTJ element 1, the write current IW flows from the free layer 2 to the pinned layer 4. As a result, by the spin transfer magnetization inversion, the data "0" is written into the MTJ element 1.

On the other hand, FIG. 5E shows the "1" write into the memory cell 10c. When "1" is written, the word line WL is driven with the drive voltage Vdh higher than the power supply voltage Vdd. For example, its drive voltage Vdh is set to Vdd+dV. Here, the voltage difference dV is a voltage difference between both ends of the MTJ element 1, and this is given by the product of the value of the write current IW and the resistance value of the MTJ element 1. The power supply voltage Vdd is applied to the first bit line BL, and the ground voltage Gnd is applied to the second bit line /BL. At this time, the write current IW flows from the first bit line BL (voltage Vdd) to the second bit line /BL (voltage 0). In short, in the MTJ element 1, the write current flows from the pinned layer 4 to the free layer 2. As a result, through the spin transfer magnetization inversion, the data "1" is written into the MTJ element 1.

Tentatively, it is supposed that the drive voltage of the word line WL is always set to the power supply voltage Vdd. In this case, the gate-source voltage when "0" is written is "Vdd−Gnd". However, the gate-source voltage when "1" is written is "Vdd−dV". The case where "1" is written is lower in the gate-source voltage and greater in the on resistance of the selection transistor TR. Thus, it is preferred to reduce the on resistance when "1" is written at least. Thus, as shown in FIG. 5B, when "1" is written, the word line WL is driven with the drive voltage Vdh higher than the power supply voltage Vdd. As a result, the gate-source voltage becomes high, and the on resistance becomes low. Therefore, the supplyable write current value is increased, and it becomes easier to supply the write current IW exceeding the threshold.

In this way, in this exemplary embodiment, the drive voltage of the word line WL is varied on the basis of the data to be written into the memory cell 10c. In short, the gate-source voltage in the selection transistor TR is adjusted as necessary, and the on resistance is reduced. Thus, the effect similar to the first exemplary embodiment is obtained.

It should be noted that the MTJ element 1 may have the top pin structure in which the pinned layer 4 is formed through the tunnel barrier layer 3 on the free layer 2, instead of the bottom pin structure. In this case, the pinned layer 4 is connected to the second bit line /BL, and the free layer 2 is connected to the selection transistor TR. In that case, the direction of the write current IW becomes opposite only, and the discussion similar to the foregoing discussion is applied thereto. In short, when "0" is written, the word line WL may be driven at the drive voltage Vdh.

4. Write Property

Figure 6:
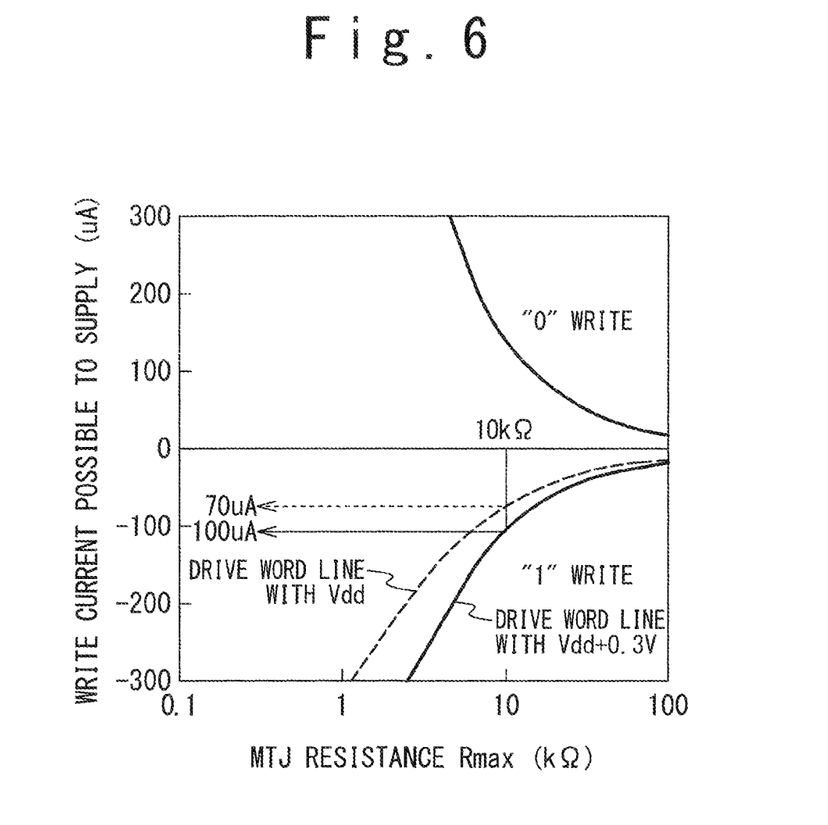
FIG. 6 is a graph showing a write property according to the present invention.

FIG. 6 shows the write property obtained through a simulation and shows the relation of the supplyable write current IW and the resistance value (maximal value Rmax) of the MTJ element 1. In the simulation, the memory cell 10c used in the third exemplary embodiment was used.

When "0" is written, the gate-source voltage is "Vdd−Gnd", and the on resistance of the selection transistor TR is relatively small. For this reason, the supplyable write current IW approximately depends on the resistance value Rmax of the MTJ element 1.

On the other hand, when "1" is written, the on resistance of the selection transistor TR is largely varied on the basis of the drive voltage of the word line WL. For this reason, the supplyable write current IW is greatly varied based on not only the resistance value Rmax of the MTJ element 1 but also the drive voltage of the word line WL. As shown in FIG. 6, as the drive voltage of the word line WL becomes higher, the supplyable write current IW is increased. For example, it is supposed that the resistance value Rmax of the MTJ element 1 is 10 kΩ. When the drive voltage is set to the power supply voltage Vdd, the supplyable write current value is 70 µA. On the other hand, when the drive voltage is set to, for example, Vdd+0.3V, it is possible to supply the write current IW up to 100 µA. In this way, according to the present invention, the supplyable write current IW can be increased.

Also, when the drive voltage is set to the power supply voltage Vdd, in order to supply the write current IW of 100 µA, the resistance value Rmax must be designed to be approximately 6 kΩ or less. In short, a limit imposed on the resistive property of the MTJ element 1 becomes strict. On the other hand, when the drive voltage is set to Vdd+0.3V, the resistance value Rmax may be designed to be 10 kΩ or less, in order to supply the write current IW of 100 µA. In short, a designable upper limit value of the resistance value Rmax can be increased, to make the allowable width of the resistance value wider. In this way, according to the present invention, it is possible to enlarge the operational margin of the MRAM of the spin transfer method.

5. Circuit Configuration Example

Figure 7:
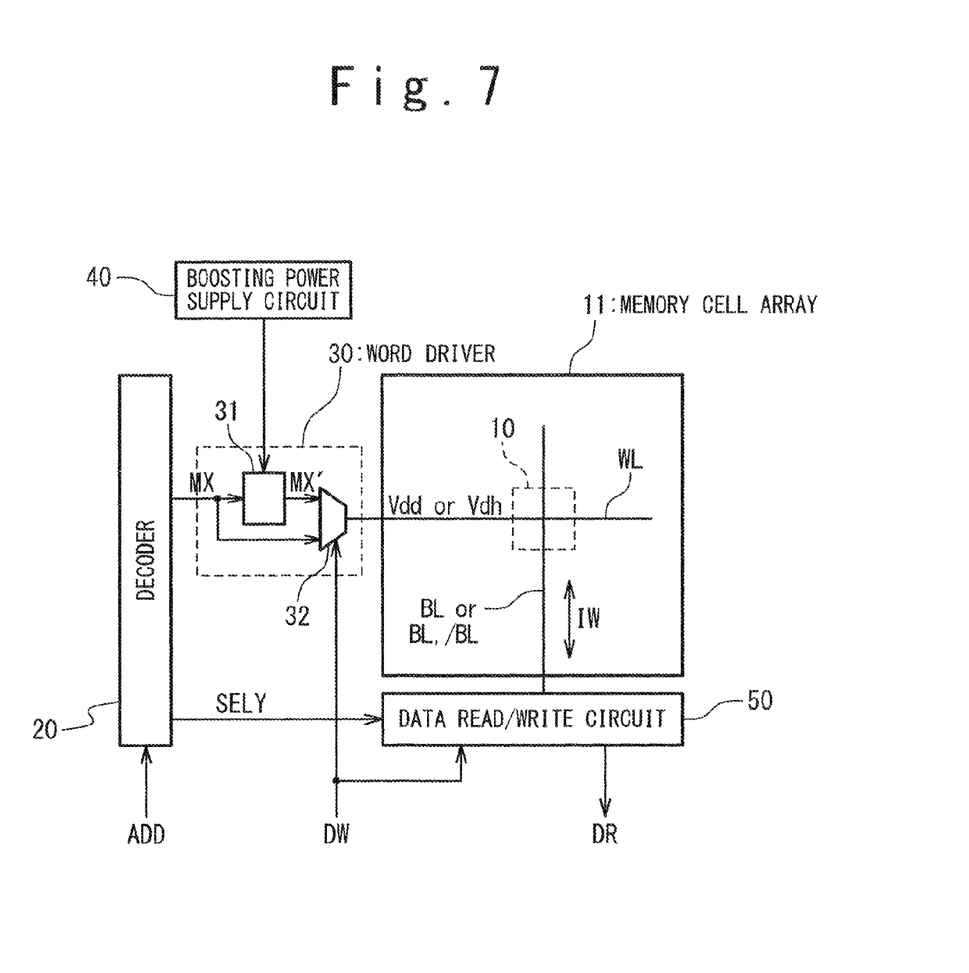
FIG. 7 is a block diagram showing configuration of the MRAM according to the present invention.

FIG. 7 shows one example of the circuit configuration to attain the write operation shown in the above-mentioned exemplary embodiments. In FIG. 7, the MRAM contains a memory cell array 11, a decoder 20, a word driver 30, a boosting power supply circuit 40, and a data read/write circuit 50.

The memory cell array 11 has a plurality of memory cells 10 that are arranged in a matrix. The memory cell 10 may be any of the memory cells 10a to 10c indicated in the above-mentioned exemplary embodiments. The word line WL is connected to the word driver 30. The bit line BL or the complementary bit line pair BL, /BL is connected to the data read/write circuit 50.

The decoder 20 decodes an address signal ADD for specifying an address of a target cell. As a result, the decoder 20 generates a word line drive signal MX for activating a target word line WL and a bit line selection signal SELY for specifying a target bit line BL. The word line drive signal MX is outputted to the word driver 30 connected to the target word line WL. The bit line selection signal SELY is outputted to the data read/write circuit 50.

The word driver 30 connected to the target word line WL drives the target word line WL, in response to the word line drive signal MX. Here, the word driver 30 changes the drive voltage of the target word line WL on the basis of a write data DW to be written into the memory cell 10. For this purpose, the write data DW is supplied to not only the data read/write circuit 50 but also the word driver 30. When the write data DW is a first data ("0" or "1"), the word driver 30 drives the target word line WL with a predetermined drive voltage (for example, the power supply voltage Vdd). On the other hand, when the write data DW is a second data ("1" or "0"), the word driver 30 drives the target word line WL with a drive voltage Vdh higher than the predetermined drive voltage.

In order to attain such operations, the word driver 30 has a level shifter 31 connected to the output of the decoder 20, and a selector (multiplexer) 32 disposed between the level shifter 31 and the word line WL.

The level shifter 31 receives the word line drive signal MX. The voltage level of the word line drive signal MX is the power supply voltage Vdd. The level shifter 31 is connected to the boosting power supply circuit 40 and converts the voltage level of the received word line drive signal MX from the power supply voltage Vdd to the high voltage Vdh. Then, the level shifter 31 outputs a word line drive signal MX' of the high voltage Vdh to the selector 32.

The selector 32 receives the word line drive signal MX (power supply voltage Vdd), the word line drive signal MX' (high voltage Vdh) outputted from the level shifter 31, and the write data DW. The selector 32 selects one of the power supply voltage Vdd and the high voltage Vdh in accordance with the write data DW and outputs the selected one as the drive voltage to the word line WL. For example, when the write data DW is the first data ("0" or "1"), the selector 32 outputs the power supply voltage Vdd. On the other hand, when the write data DW is the second data ("1" or "0"), the selector 32 outputs the high voltage Vdh.

It should be noted that the configuration of the word driver 30 is not limited to the configuration shown in FIG. 7. If the drive voltage of the word line WL can be changed on the basis of the write data DW, any circuit can be applied. For example, a charge pump circuit may be applied to the word driver 30, to generate the drive voltage Vdh higher than the power supply voltage Vdd.

The data read/write circuit 50 includes a write circuit and a sensing amplifier circuit. When the data is written, the data read/write circuit 50 receives the bit line selection signal SELY and the write data DW. The data read/write circuit 50 applies a voltage corresponding to the write data DW, to the bit line BL (or the complementary bit line pair BL and /BL) specified by the bit line selection signal SELY. The applied voltages are as indicated in the first to third exemplary embodiments. As a result, the write current IW is supplied in the two ways to the memory cell 10, so that the write operation based on the spin transfer method is attained.

When the data is read, the data read/write circuit 50 applies a predetermined voltage to the bit line EL (or the complementary bit line pair BL, /BL) specified by the bit line selection signal SELY. As a result, a read current flows through the MTJ element 1. The data read/write circuit 50 detects the resistance value of the MTJ element 1 in accordance with the value of the read current flowing through the bit line BL and senses the data stored in the target cell, in accordance with it. The sensed data is outputted as a read data DR.

With the above-described circuit configurations, it is possible to attain the write operations indicated in the above-mentioned exemplary embodiments. It should be noted that the configuration of the present invention is not limited to those shown in the above-mentioned exemplary embodiments, and it can be properly changed or modified by one skilled in the art, in the range without departing from the spirit and scope of the present invention.

The invention claimed is:

1. A magnetic random access memory utilizing spin transfer, comprising:

a memory cell array comprising a plurality of memory cells, each memory cell comprising a magnetic resistance element and a selection transistor having one of source/drain electrodes connected with one end of said magnetic resistance element;

a plate line to which one of the source/drain electrodes is connected, or the plate line being connected to the other end of said magnetic resistance element; and a word driver configured to drive a word line which is connected with a gate electrode of said selection transistor, wherein said word driver changes a drive voltage of said word line for a write data to be written in said magnetic resistance element, based on the write data supplied to said word driver, and the plate line has a predetermined voltage that is a middle voltage between a power supply voltage and a ground voltage, wherein said word driver drives said word line with a first drive voltage that is the power supply voltage, when the write data is a first data, and said word driver drives said word line with a second drive voltage that is the predetermined plate line voltage and which is higher than the first drive voltage, when the write data is a second data complementary to said first data.

2. The magnetic random access memory according to claim 1, wherein a source voltage of said selection transistor is a first source voltage, when the write data is the first data, and the source voltage of said selection transistor is a second source voltage when the write data is the second data.

3. The magnetic random access memory according to claim 1, further comprising:

a common interconnection connected with the other of said source/drain electrodes;

a bit line connected with the other end of said magnetic resistance element; and a write circuit connected with said bit line, wherein a voltage of said common interconnection is fixed to a predetermined voltage, said write circuit applies a voltage lower than the predetermined voltage to said bit line, when the write data is the first data, and said write circuit applies a voltage higher than the predetermined voltage to said bit line, when the write data is the second data.

4. The magnetic random access memory according to claim 1, further comprising:

a bit line connected with the other of said source/drain electrodes;

a common interconnection connected with the other of said magnetic resistance element; and a write circuit connected with said bit line, wherein a voltage of said common interconnection is fixed to the predetermined voltage, said write circuit applies a voltage lower than the predetermined voltage to said bit line, when the write data is the first data, and said write circuit applies a voltage higher than the predetermined voltage to said bit line, when the write data is the second data.

5. The magnetic random access memory according to claim 1, wherein said word driver comprises:

a level shifter configured to convert the first drive voltage into said second drive voltage; and a selector configured to receive the first drive voltage, the second drive voltage outputted from said level shifter and the write data, said selector outputs the first drive voltage to said word line when the write data is the first data, and said selector outputs the second drive voltage to said word line when the write data is the second data.

6. The magnetic random access memory according to claim 1, wherein said magnetic resistance element is a magnetic tunnel junction element.

7. The magnetic random access memory according to claim 6, wherein the magnetic tunnel junction element has a bottom pin structure in which a free layer is formed through a tunnel barrier layer on a pinned layer.

8. The magnetic random access memory according to claim 1, wherein the plate line is parallel to the word line.

9. A magnetic random access memory utilizing spin transfer, comprising:

a memory cell which comprises a magnetic resistance element and a selection transistor having one of source/drain electrodes connected with one end of said magnetic resistance element;

a word driver configured to drive a word line which is connected with a gate electrode of said selection transistor;

a first bit line connected with the other of said source/drain electrodes;

a second bit line connected with the other end of said magnetic resistance element; and a write circuit connected with said first bit line and said second bit line, wherein said word driver changes a drive voltage of said word line for a write data to be written in said magnetic resistance element, based on the write data supplied to said word driver, said word driver drives said word line with a first drive voltage, when the write data is a first data, said word driver drives said word line with a second drive voltage which is higher than the first drive voltage, when the write data is a second data complementary to said first data, and wherein said write circuit applies a voltage lower than that applied to said second bit line, to said first bit line, when the write data is the first data, and said write circuit applies a voltage higher than that applied to said second bit line, to said first bit line, when the write data is the second data.

10. A writing method into a magnetic random access memory based on a spin transfer method, wherein said magnetic random access memory has a memory cell array comprising a plurality of memory cells, each memory cell comprising a magnetic resistance element, and a selection transistor having one of source/drain electrodes which is connected with one end of said magnetic resistance element, said writing method comprising:

driving a word line connected with a gate electrode of said selection transistor with a first drive voltage, when a write data to be written into said magnetic resistance element is a first data; and driving said word line with a second drive voltage higher than the first drive voltage, when the write data is a second data complementary to the first data, wherein a plate line is connected to one of the source/drain electrodes, or the plate line is connected to the other end of said magnetic resistance element, and the plate line has a predetermined voltage that is that is the second line voltage and is a middle voltage between a power supply voltage and a ground voltage.

11. The method according to claim 10, wherein said magnetic resistance element is a magnetic tunnel junction element.

12. The method according to claim 11, wherein the magnetic tunnel junction element has a bottom pin structure in which a free layer is formed through a tunnel barrier layer on a pinned layer.

13. The method according to claim 10, wherein a source voltage of said selection transistor is a first source voltage, when the write data is the first data, and
the source voltage of said selection transistor is a second source voltage when the write data is the second data.

14. The method according to claim 10, the magnetic random access memory further comprising:
a common interconnection connected with the other of said source/drain electrodes;
a bit line connected with the other end of said magnetic resistance element; and
a write circuit connected with said bit line,
wherein a voltage of said common interconnection is fixed to a predetermined voltage,
said write circuit applies a voltage lower than the predetermined voltage to said bit line, when the write data is the first data, and
said write circuit applies a voltage higher than the predetermined voltage to said bit line, when the write data is the second data.

15. The method according to claim 10, the magnetic random access memory further comprising:
a bit line connected with the other of said source/drain electrodes;
a common interconnection connected with the other of said magnetic resistance element; and
a write circuit connected with said bit line,
wherein a voltage of said common interconnection is fixed to the predetermined voltage,
said write circuit applies a voltage lower than the predetermined voltage to said bit line, when the write data is the first data, and
said write circuit applies a voltage higher than the predetermined voltage to said bit line, when the write data is the second data.

16. The method according to claim 10, wherein said word driver comprises:
a level shifter configured to convert the first drive voltage into said second drive voltage; and
a selector configured to receive the first drive voltage, the second drive voltage outputted from said level shifter and the write data,
said selector outputs the first drive voltage to said word line when the write data is the first data, and
said selector outputs the second drive voltage to said word line when the write data is the second data.

17. The method according to claim 10, wherein the plate line is parallel to the word line.

18. A writing method into a magnetic random access memory based on a spin transfer method, wherein said magnetic random access memory has a memory cell array comprising a plurality of memory cells, each memory cell comprising a magnetic resistance element, and a selection transistor having one of source/drain electrodes which is connected with one end of said magnetic resistance element, said writing method comprising:
driving a word line connected with a gate electrode of said selection transistor with a first drive voltage, when a write data to be written into said magnetic resistance element is a first data; and
driving said word line with a second drive voltage higher than the first drive voltage, when the write data is a second data complementary to the first data,
wherein the magnetic random access memory further comprises:
a first bit line connected with the other of said source/drain electrodes;
a second bit line connected with the other end of said magnetic resistance element; and
a write circuit connected with said first bit line and said second bit line,
wherein said write circuit applies a voltage lower than that applied to said second bit line, to said first bit line, when the write data is the first data, and
said write circuit applies a voltage higher than that applied to said second bit line, to said first bit line, when the write data is the second data.

* * * * *

UNITED STATES PATENT AND TRADEMARK OFFICE
CERTIFICATE OF CORRECTION

PATENT NO. : 8,693,238 B2
APPLICATION NO. : 12/376925
DATED : April 8, 2014
INVENTOR(S) : Sakimura et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 708 days.

Signed and Sealed this
Twenty-ninth Day of September, 2015

Michelle K. Lee
*Director of the United States Patent and Trademark Office*